(12) United States Patent
Tsai et al.

(10) Patent No.: US 6,683,385 B2
(45) Date of Patent: Jan. 27, 2004

(54) LOW PROFILE STACK SEMICONDUCTOR PACKAGE

(75) Inventors: Chung-Che Tsai, Taipei (TW); Wei-Heng Shan, Hsinchu (TW)

(73) Assignee: UltraTera Corporation (TW)

( * ) Notice: Subject to any disclaimer, the term of this patent is extended or adjusted under 35 U.S.C. 154(b) by 42 days.

(21) Appl. No.: 10/127,983

(22) Filed: Apr. 23, 2002

(65) Prior Publication Data

US 2003/0197282 A1 Oct. 23, 2003

(51) Int. Cl.[7] ................................................ H01L 23/48
(52) U.S. Cl. ........................ 257/777; 257/686; 257/784; 257/723; 257/724; 257/725
(58) Field of Search .................................. 257/686, 777, 257/723, 784, 724, 725

(56) References Cited

U.S. PATENT DOCUMENTS 6,400,007 B1 * 6/2002 Wu et al. .................... 257/686
6,414,384 B1 * 7/2002 Lo et al. ..................... 257/685
2001/0054762 A1 * 12/2001 Yamazaki et al. .......... 257/723

* cited by examiner

Primary Examiner—David L. Talbott
Assistant Examiner—Luan Thai
(74) Attorney, Agent, or Firm—Peter F. Corless; Steven M. Jensen; Edward & Angell, LLP

(57) ABSTRACT

A low profile stack semiconductor package is proposed. A lower chip having centrally-situated bond pads is mounted on a substrate, and electrically connected to the substrate by bonding wires. A cushion member is peripherally situated on the lower chip, allowing the bonding wires to extend from the bond pads in a direction parallel to the lower chip, and to reach the cushion member beyond which the bonding wires turn downwardly to be directed toward the substrate. An adhesive is applied on the lower chip, for encapsulating the bond pads, cushion member and bonding wires. This allows an upper chip to be readily stacked on the lower chip by attaching the upper chip to the adhesive, without affecting or damaging structural or electrical arrangement formed on the lower chip.

22 Claims, 3 Drawing Sheets

LOW PROFILE STACK SEMICONDUCTOR PACKAGE

FIELD OF THE INVENTION

The present invention relates to semiconductor packages, and more particularly, to a multi-chip semiconductor package mounted with stacked chips therein.

BACKGROUND OF THE INVENTION

Stack semiconductor packages are advanced packaging technology, which is characterized by stacking a plurality of chips in a single package structure, so as to desirably multiply operational performances and memory capacity for semiconductor packages.

Conventional chip-stack structures are exemplified with reference to FIGS. 5A to 5C. As shown in FIG. 5A, two chips 10, 11 are stacked on a substrate 12, and electrically connected to the substrate 12 by means of bonding wires 13, 14 respectively. Such a structure is limited to a relatively smaller size of the overlying chip 11 with respect to the underlying chip 10, whereby forming of the bonding wires 13 would not be interfered by stacked arrangement of the chips 10, 11.

A solution to chip-size limitation, as shown in FIG. 5B, is to apply an adhesive 15 between the two chips 10, 11 in a manner that, the adhesive 15 is sufficiently dimensioned in thickness for allowing the overlying chip 11 to be mounted on the underlying chip 10 without coming into contact with the bonding wires 13, such that the overlying chip 11 can be sized equally or even larger in surface area than the underlying chip 10.

Alternatively, as shown in FIG. 5C, the adhesive 15 can further spread to cover wire loops 130 of the bonding wires 13 received between the chips 10, 11. Such a structure provides significant benefits. First, the bonding wires 13 can be firmly assured without being interfered by the chip-stack arrangement. Moreover, the wire loops 130 are held in position within the adhesive 15, and thereby the bonding wires 13 would be less likely to suffer wire sagging or sweep due to strong mold-flow impact of a molding compound or resin for forming a chip-enclosed encapsulant (not shown) during a molding process. Wire sagging or sweep would cause electrical contact or short circuit between adjacent bonding wires or between bonding wires and chips, thereby undesirably damaging electrical quality and yield for fabricated products.

However, the above conventional chip-stack structures are primarily used to accommodate chips with peripherally-situated bond pads where bonding wires are bonded, but not suitably applied for stacking chips with centrally-situated bond pads such as DRAM (dynamic random access memory) chips. For example, in the chip-stack structures of FIGS. 5A and 5B, if the underlying chip 10 is formed with centrally-situated bond pads, either the overlying chip 11 (FIG. 5A) or the adhesive 15 (FIG. 5B) would undesirably cover the bond pads, thereby making bonding wires 13 not possibly connected to the bond pads for electrically connecting the underlying chip 10 to the substrate 12.

For the chip-stack structure illustrated in FIG. 5C, wire loops 130 of the bonding wires 13 (bonded to peripherally-situated bond pads 16) are encapsulated by the adhesive 15. If bond pads 16 formed on the underlying chip 10 are adapted to be centrally situated, the wire loops 130 extending from centrally-situated bond pads would need to be made with a considerable height, so as to prevent the bonding wires 13 from coming into contact with edge of the underlying chip 10. As a result, the adhesive 15 correspondingly needs to increase in thickness for accommodating the enlarged wire loops 130, for the purposes of positioning the bonding wires 13 and preventing short circuit or wire sweep from occurrence. Such structural arrangement would greatly increase overall package profile, thereby not applicable in practical use or fabrication for semiconductor packages.

Therefore, it is highly desired to develop a semiconductor package for stacking chips with centrally-situated bond pads, by which package profile can be desirably miniaturized as well as electrical quality can be firmly assured.

SUMMARY OF THE INVENTION an objective of the present invention is to provide a low profile stack semiconductor package for use to stack chips having centrally-situated bond pads, such as DRAM (dynamic random access memory) chips, in a face-up (active surface up) manner.

Another objective of the invention is to provide a low profile stack semiconductor package, which can effectively reduce size or profile of overall package structure.

A further objective of the invention is to provide a low profile stack semiconductor package, which can significantly maintain electrical quality thereof, and prevent short circuit or wire sweep from occurrence.

A further objective of the invention is to provide a low profile stack semiconductor package, which can desirably reduce pitch spacing between adjacent bonding wires, allowing the semiconductor package to be suitably applied to high-level products with fine-pitch structural arrangement.

In accordance with the above and other objectives, the present invention proposes a low profile stack semiconductor package, comprising: a substrate; a lower chip having an active surface formed with a plurality of centrally-situated bond pads thereon, and a non-active surface opposed to the active surface, wherein the non-active surface is mounted on the substrate, and a cushion member is formed at a peripheral edge on the active surface of the lower chip; a plurality of bonding wires for electrically connecting the lower chip to the substrate in a manner that, the bonding wires extend from the bond pads of the lower chip in a direction substantially parallel to the active surface of the lower chip, and reach the cushion member beyond which the bonding wires turn to be directed toward the substrate, wherein the bonding wires are free of forming wire loops as extending above the active surface of the lower chip, and the cushion member is interposed between the bonding wires and the lower chip, allowing the bonding wires to be free of contact with the lower chip; an adhesive applied over the active surface of the lower chip in a manner as to encapsulate the bond pads, the cushion member and part of the bonding wires extending above the lower chip; an upper chip having an active surface and a non-active surface opposed to the active surface, wherein the non-active surface is mounted on the adhesive, and the active surface is electrically connected to the substrate; an encapsulant for encapsulating the lower and upper chips, and the bonding wires; and a plurality of solder balls implanted on the substrate and exposed to outside of the encapsulant, for electrically connecting the lower and upper chip to an external device.

By the above package structure, chips having centrally-situated bond pads, such as DRAM chips, can be easily stacked on a substrate in a face-up (active surface up)

manner through the use of an adhesive as an interposer between adjacent vertically stacked chips. Bonding wires for electrically connecting a chip to the substrate, extend from centrally-situated bond pads of the chip in a direction substantially parallel to the chip, without forming wire loops above the chip. Therefore, when applying the adhesive over the chip, the adhesive can be made considerably thin for sufficiently encapsulating the bonding wires. This allows the chip to be readily stacked with another chip thereon. By virtue of the adhesive forming a protection layer on an underlying chip, stacking of an overlying chip over the underlying chip would not affect or damage structural or electrical arrangement (e.g. bonding wires) formed on the underlying chip.

A cushion member peripherally formed on a chip, is used to space bonding wires apart from the chip, by which undesirable contact or short circuit between the bonding wires and chip can be prevented from occurrence. The cushion member is preferably made of an elastic or semi-cured insulating material. Thereby, when bonding wires come into contact with the cushion member, each of the bonding wires would be partly embedded in the cushion member. Further with the adhesive being applied over the bonding wires, the bonding wires can be firmly held in position and properly spaced apart from each other as being interposed between the adhesive and cushion member, without causing wire sagging or sweep that leads to short circuit or adversely damages electrical quality of fabricated packages. Therefore, bonding wires can be more densely or closely arranged in a manner as to reduce pitch spacing between adjacent bonding wires, making the package structure suitably applied to high-level products with fine-pitch structural arrangement.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Preferred embodiments for a low profile stack semiconductor package proposed in the present invention are described in more detail as follows with reference to FIGS. 1 to 4. These drawings are made in simplicity for exemplification purpose, and used for depicting structural features or characteristics of the semiconductor package, it should be understood that, the semiconductor package of the invention is more complexly structured in practical fabrication.

Figure 1:
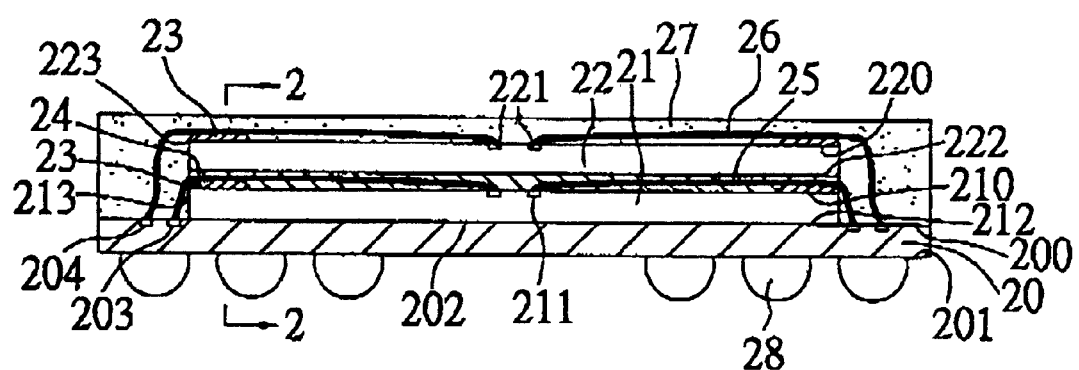
FIG. 1 is a cross-sectional view of an embodiment of a semiconductor package of the invention.

As shown in FIG. 1, the low profile stack semiconductor package of the invention comprises a substrate 20; a lower chip 21 mounted on the substrate 20; an upper chip 22 stacked on the lower chip 21 by means of an adhesive 24 interposed between the lower and upper chips 21, 22; a plurality of bonding wires 25, 26 for electrically connecting the lower and upper chips 21, 22 respectively to the substrate 20; an encapsulant 27 for encapsulating the lower and upper chips 21, 22 and the bonding wires 25, 26; and a plurality of solder balls 28 for electrically connecting the lower and upper chips 21, 22 to an external device (not shown).

A substrate 20 has an upper surface 200 and a lower surface 201 opposed to the upper surface 200, wherein the upper surface 200 is defined with a chip attach area 202, a first wire bonding area 203 surrounding the chip attach area 202, and a second wire bonding area 204 surrounding the first wire bonding area 203.

A lower chip 21 has an active surface 210 formed with a plurality of centrally-situated bond pads 211 thereon, and a non-active surface 212 opposed to the active surface 210. The lower chip 21 is mounted on the substrate 20 in a manner that, the non-active surface 212 of the lower chip 21 is attached to the chip attach area 202 on the upper surface 200 of the substrate 20. And, a cushion member 23 is formed at a peripheral edge 213 on the active surface 210 of the lower chip 21. The cushion member 23 is made of an insulating material that is preferably elastic such as elastomer, or semi-cured. Such a lower chip 21 provided with centrally-situated bond pads 211 can be a DRAM (dynamic random access memory) chip.

A plurality of lower bonding wires 25 are formed to electrically connect the lower chip 21 to the upper surface 200 of the substrate 20. The lower bonding wires 25 extend from the bond pads 211 of the lower chip 21 in a direction substantially parallel to the active surface 210 of the lower chip 21, and reach the cushion member 23 beyond which the lower bonding wires 25 turn downwardly to be directed toward the substrate 20 until being bonded at the first wire bonding area 203 on the substrate 20, wherein the cushion member 23 is interposed between the lower bonding wires 25 and the lower chip 21, allowing the lower bonding wires 25 not to come into contact with the lower chip 21. The lower bonding wires 25 are adapted to be free of forming wire loops as extending above the active surface 210 of the lower chip 21, by which structural thickness would be significantly reduced as compared to conventional wire bonding technology of forming considerably high wire loops. And, in free concern of undesirable contact between the lower bonding wires 25 and the lower chip 21, the lower bonding wires 25 can turn downwardly by a steep angle beyond the cushion member 23, and steeply extend to reach the first wire bonding area 203 of the substrate 20. As a result, the first wire bonding area 203 as well as occupied area on the substrate 20 can both be desirably reduced.

Figure 5A:
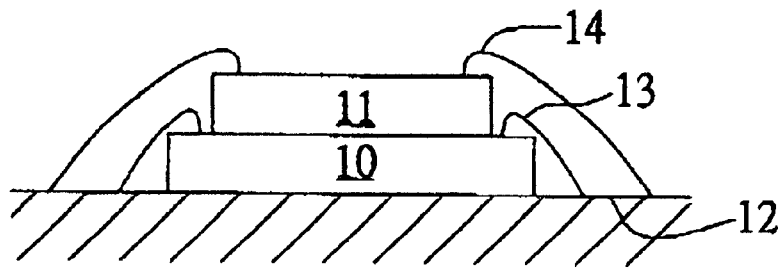
FIGS. 5A–5C (PRIOR ART) are cross-sectional view of conventional chip-stack structure.
Figure 5B:
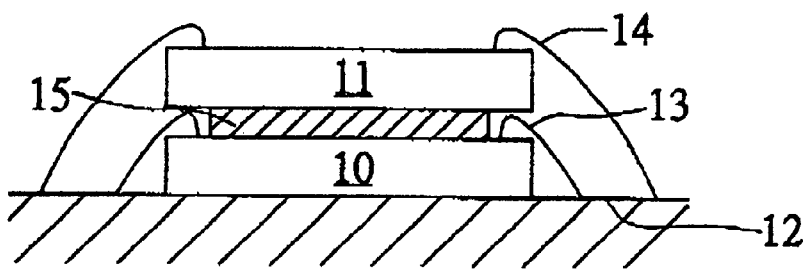
Figure 5C:
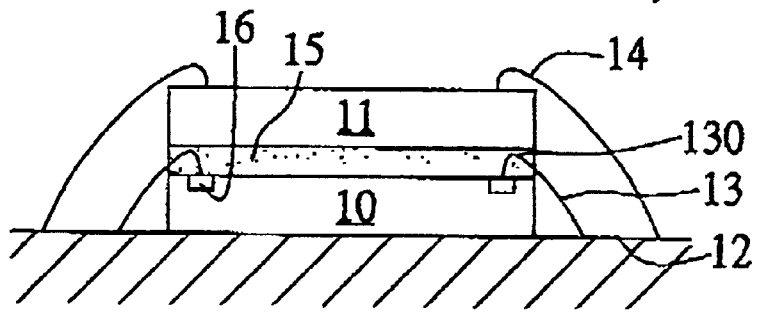

As adhesive 24 is applied over the active surface 210 of the lower chip 21, for encapsulating the bond pads 211, the cushion member 23, and part of the lower bonding wires 25 extending above the lower chip 21. The adhesive 24 is used to allow other chips to be stacked on the lower chip 21 without affecting or damaging structural or electrical arrangement formed on the active surface 210 of the lower chip 21. As the lower bonding wires 25 are substantially arranged in parallel to the active surface 210 of the lower chip 21 without forming wire loops, the adhesive 24 can be dimensioned as thin as possible in a manner as to fully cover the lower bonding wires 25. Unlike a conventional adhesive being made with a considerable thickness for sufficiently accommodating wire loops of bonding wires (FIG. 5C), the adhesive 24 of the invention is relatively much thinner, and thereby helps reduce overall structural thickness.

Figure 2:
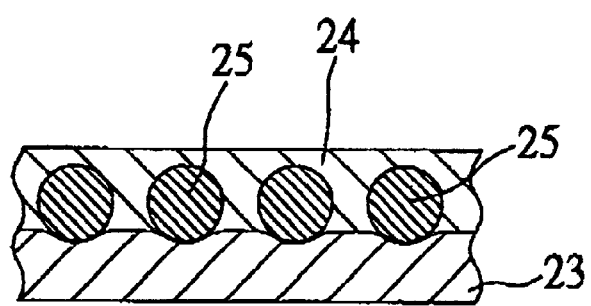
FIG. 2 is a cross-sectional view showing bonding wires interposed between an adhesive and a cushion member in the semiconductor package of FIG. 1 by cutting along a line 2—2.

As shown in FIG. 2, with the cushion member 23 being made of an elastic or semi-cured insulating material, the lower bonding wires 25 in contact with the cushion member 23 would be each partly embedded in the cushion member 23. And, with the adhesive 24 being applied over the lower chip 21 for encapsulating the lower bonding wires 25, the lower bonding wires 25 would be firmly interposed between the adhesive 24 and the cushion member 23. This allows the lower bonding wires 25 to be held in position and properly spaced apart from each other, without causing wire sagging or sweep that leads to short circuit or adversely damages electrical connection of the lower bonding wires 25.

An upper chip 22, which is structured similarly to the lower chip 21, has an active surface 220 formed with a plurality of centrally-situated bond pads 221 thereon, and a non-active surface 222 opposed to the active surface 220. The upper chip 22 is mounted on the lower chip 21 in a manner that, the non-active surface 222 of the upper chip 22 is attached to the adhesive 24. And, a cushion member 23 is formed at a peripheral edge 223 on the active surface 220 of the supper chip 22. The cushion member 23 is also preferably made of an elastic or semi-cured insulating material. Such an upper chip 22 provided with centrally-situated bond pads 221 can also be a DRAM chip, and equally dimensioned to the lower chip 21. This therefore allows same sized DRAM chips to be vertically stacked in a package structure.

A plurality of upper bonding wires 26 are formed to electrically connect the upper chip 22 to the upper surface 200 of the substrate 20. The upper bonding wires 26 extend from the bond pads 221 of the upper chip 22 in a direction substantially parallel to the active surface 220 of the upper chip 22, and reach the cushion member 23 beyond which the upper bonding wires 26 turn downwardly to be directed toward the substrate 20 until being bonded at the second wire bonding area 204 on the substrate 20, wherein the cushion member 23 is interposed between the upper bonding wires 26 and the upper chip 22, allowing the upper bonding wires 26 not to come into contact with the upper chip 22. The upper bonding wires 26 are adapted to be free of forming wire loops as extending above the active surface 220 of the upper chip 22. By such similar arrangement of the upper bonding wires 26 to the lower bonding wires 25, another DRAM chip or other-type chip can be readily stacked on the upper chip 22 in a low profile (thickness) manner through the use of the above adhesive as an interposer.

An encapsulant 27 is formed of a molding compound such as epoxy resin by performing a molding process. The encapsulant 27 is used for hermetically encapsulating the lower and upper chips 21, 22, and the lower and upper bonding wires 25, 26, so as to isolating and protecting internal components of the semiconductor package of the invention from external impact and contaminant.

Finally, a plurality of a solder balls 28 are implanted on the lower surface 201 of the substrate 20. The solder balls 28 serve as I/O (input/output) ports of the semiconductor package of the invention, for electrically connecting the lower and upper chips 21, 22 to an external device such as a printed circuit board (PCB, not shown).

By the above package structure, chips with centrally-situated bond pads (such as DRAM chips) can be vertically stacked on a substrate in a face-up (active surface up) and low profile manner through the use of an adhesive that acts as an interposer between adjacent stacked chips. Moreover, bonding wires for electrically connecting the chips to the substrate can be firmly held in position and interposed between the adhesive and a cushion member as described above, electrical quality and yield of fabricated semiconductor packages would be well assured without causing wire sweep or short circuit. As such, the bonding wires can be more densely or closely arranged in a manner as to reduce pitch spacing between adjacent bonding wires, making the semiconductor package of the invention suitably applied to high-level products with fine-pitch structural arrangement.

Figure 3:
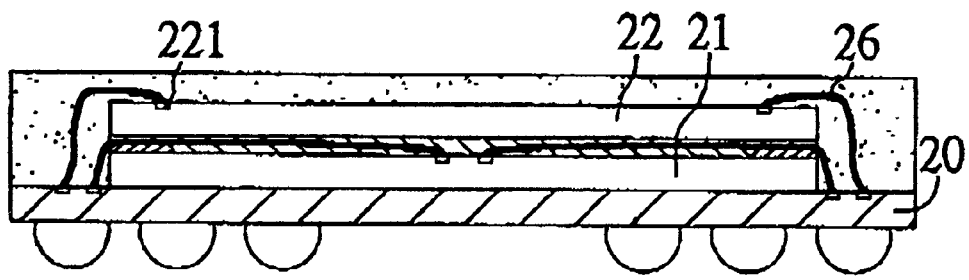
FIG. 3 is a cross-sectional view of another embodiment of the semiconductor package of the invention.

FIG. 3 illustrates another embodiment of the semiconductor package of the invention. In this embodiment, the upper chip 22 stacked on the lower chip 21 is formed with a plurality of peripherally-situated bond pads 221, instead of a DRAM chip having centrally-situated bond pads. And, such an upper chip 22 can be flexibly dimensioned to be equal to, larger or smaller than the lower chip 21. The upper bonding wires 26 can also be flexibly arranged with forming of wire loops, for electrically connecting the upper chip 22 to the substrate 20. Therefore, the package structure of the invention is suitably applicable for stacking wide-range types of chips on a face-up DRAM chip (lower chip 21).

Figure 4A:
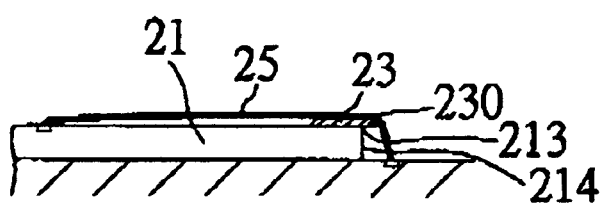
FIGS. 4A and 4B are schematic diagrams showing embodiments of a cushion member used in the semiconductor package of the invention.
Figure 4B:
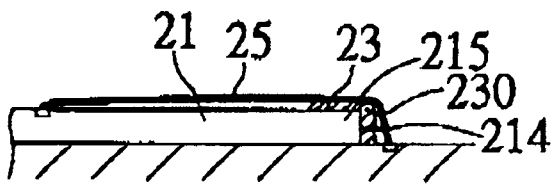

FIGS. 4A and 4B illustrate embodiments of a cushion member used in the semiconductor package of the invention. As shown in FIG. 1, the cushion member 23 e.g. on the lower chip 21 is flush with the peripheral edge 213 of the active surface 210 of the lower chip 21, for preventing the lower bonding wires 25 from coming into contact with the lower chip 21. Alternatively, as shown in FIG. 4A, the cushion member 23 can be adapted to extend outwardly beyond the peripheral edge 213 of the lower chip 21, allowing a portion 430 of the cushion member 23 to protrude beyond an edge side 214 of the lower chip 21. Moreover, as shown in FIG. 4B, the protruding portion 230 of the cushion member 23 can be further adapted to extend downwardly to reach the edge side 214 of the lower chip 21, so as to entirely cover an edge corner 215 of the lower chip 21. With further extension of the cushion member 23, the lower bonding wires 25 can be more effectively assured to be spaced apart from the lower chip 21, without causing undesirable contact or short circuit between the lower bonding wires 25 and the lower chip 21, in favor of maintaining satisfactory quality and yield for fabricated packages. It should be understood that, the above embodiments of the cushion member 23 are also applicable to the cushion member 23 formed on the upper chip 22 as shown in FIG. 1.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A low profile stack semiconductor package, comprising:

a substrate;

a lower chip having an active surface formed with a plurality of centrally-situated bond pads thereon, and a non-active surface opposed to the active surface, wherein the non-active surface is mounted on the substrate, and a cushion member is formed at a peripheral edge on the active surface of the lower chip;

a plurality of bonding wires for electrically connecting the lower chip to the substrate in a manner that, the bonding wires extend from the bond pads of the lower chip in a direction substantially parallel to the active surface of the lower chip, and reach the cushion member beyond which the bonding wires turn to be directed toward the substrate, wherein the bonding wires are free of forming wire loops as extending above the active surface of the lower chip, and the cushion member is interposed between the bonding wires and the lower chip, allowing the bonding wires to be free of contact with the lower chip;

an adhesive applied over the active surface of the lower chip, for encapsulating the bond pads, the cushion member, and part of the bonding wires extending above the lower chip;

an upper chip having an active surface and a non-active surface opposed to the active surface, wherein the non-active surface is mounted on the adhesive, and the active surface is electrically connected to the substrate;

an encapsulant for encapsulating the lower and upper chips, and the bonding wires; and a plurality of solder balls implanted on the substrate and exposed to outside of the encapsulant, for electrically connecting the lower and upper chips to an external device.

2. The semiconductor package of claim 1, wherein the lower chip is a DRAM (dynamic random access memory) chip.

3. The semiconductor package of claim 1, wherein the cushion member is made of an insulating material.

4. The semiconductor package of claim 3, wherein the insulating material is elastic.

5. The semiconductor package of claim 4, wherein the bonding wires in contact with the cushion member are each partly embedded in the cushion member, and held in position by the cushion member.

6. The semiconductor package of claim 3, wherein the insulating material is semi-cured during forming of the bonding wire.

7. The semiconductor package of claim 6, wherein the bonding wires in contact with the cushion member are each partly embedded in the cushion member, and held in position by the cushion member.

8. The semiconductor package of claim 1, wherein the cushion member is flush with the peripheral edge of the active surface of the lower chip.

9. The semiconductor package of claim 1, wherein the cushion member extends outwardly beyond the peripheral edge of the active surface of the lower chip, allowing a portion of the cushion member to provide beyond an edge side of the lower chip.

10. The semiconductor package of claim 1, wherein the cushion member extends outwardly beyond the peripheral edge of the active surface of the lower chip, and turns downwardly to reach an edge side of the lower chip, so as to entirely cover an edge corner at the active surface of the lower chip.

11. A low profile stack semiconductor package, comprising:

a substrate;

a lower chip having an active surface formed with a plurality of centrally-situated bond pads thereon, and a non-active surface opposed to the active surface, wherein the non-active surface is mounted on the substrate, and a cushion member is formed at a peripheral edge on the active surface of the lower chip;

a plurality of lower bonding wires for electrically connecting the lower chip to the substrate in a manner that, the lower bonding wires extend from the bond pads of the lower chip in a direction substantially parallel to the active surface of the lower chip, and reach the cushion member beyond which the lower bonding wires turn to be directed toward the substrate, wherein the lower bonding wires are free of forming wire loops as extending above the active surface of the lower chip, and the cushion member is interposed between the lower bonding wires and the lower chip, allowing the lower bonding wires to be free of contact with the lower chip;

an adhesive applied over the active surface of the lower chip, for encapsulating the bond pads, the cushion member, and part of the lower bonding wires extending above the lower chip;

an upper chip having an active surface formed with a plurality of centrally-situated bond pads thereon, and a non-active surface opposed to the active surface, wherein the non-active surface is mounted on the adhesive, and a cushion member is formed at a peripheral edge on the active surface of the upper chip;

a plurality of upper bonding wires for electrically connecting the upper chip to the substrate in a manner that, the upper bonding wires extend from the bond pads of the upper chip and reach the cushion member, beyond which the upper bonding wires turn to be directed toward the substrate, wherein the cushion member is interposed between the upper bonding wires and the upper chip, allowing the upper bonding wires to be free of contact with the upper chip;

an encapsulant for encapsulating the lower and upper chips, and the lower and upper bonding wires; and a plurality of solder balls implanted on the substrate and exposed to outside of the encapsulant, for electrically connecting the lower and upper chips to an external device.

12. The semiconductor package of claim 11, wherein the lower and upper chips are each a DRAM (dynamic random access memory) chip.

13. The semiconductor package of claim 11, wherein the upper chip is dimensioned equally to the lower chip.

14. The semiconductor package of claim 11, wherein the upper bonding wires extend from the bond pads of the upper chip in a direction substantially parallel to the active surface of the upper chip, allowing the upper bonding wires to be free of forming wire loops as extending above the active surface of the upper chip.

15. The semiconductor package of claim 11, wherein the cushion member is made of an insulating material.

16. The semiconductor package of claim 15, wherein the insulating material is elastic.

17. The semiconductor package of claim 16, wherein the bonding wires in contact with the cushion member are each partly embedded in the cushion member, and held in position by the cushion member.

18. The semiconductor package of claim 15, wherein the insulating material is semi-cured during forming of the bonding wires.

19. The semiconductor package of claim 18, wherein the bonding wires in contact with the cushion member are each partly embedded in the cushion member, and held in position by the cushion member.

20. The semiconductor package of claim 11, wherein the cushion member is flush with the peripheral edge of the active surface of the chip.

21. The semiconductor package of claim 11, wherein the cushion member extends outwardly beyond the peripheral edge of the active surface of the chip, allowing a portion of the cushion member to protrude beyond an edge side of the chip.

22. The semiconductor package of claim 11, wherein the cushion member extends outwardly beyond the peripheral edge of the active surface of the chip, and turns downwardly to reach an edge side of the chip, so as to entirely cover an edge corner at the active surface of the chip.

* * * * *